United States Patent
Guo et al.

(10) Patent No.: US 11,468,370 B1
(45) Date of Patent: Oct. 11, 2022

(54) COMMUNICATION COMPRESSION METHOD BASED ON MODEL WEIGHT DISTRIBUTION IN FEDERATED LEARNING

(71) Applicant: SHANDONG UNIVERSITY, Jinan (CN)

(72) Inventors: Shuaishuai Guo, Jinan (CN); Shuheng Lv, Jinan (CN); Haixia Zhang, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 0 days.

(21) Appl. No.: 17/653,778

(22) Filed: Mar. 7, 2022

(51) Int. Cl.
*G06N 20/00* (2019.01)
*G06K 9/62* (2022.01)
*H03M 7/30* (2006.01)
*H03M 7/40* (2006.01)

(52) U.S. Cl.
CPC ........... *G06N 20/00* (2019.01); *G06K 9/6277* (2013.01); *H03M 7/3059* (2013.01); *H03M 7/40* (2013.01)

(58) Field of Classification Search
CPC ... G06N 20/00; G06K 9/6277; H03M 7/3059; H03M 7/40
USPC ................................ 341/65, 67, 107; 706/12
See application file for complete search history.

(56) References Cited

U.S. PATENT DOCUMENTS

| | | | | |
|---|---|---|---|---|
| 10,558,738 | B1* | 2/2020 | Strimel | .................. G10L 15/26 |
| 2018/0018590 | A1* | 1/2018 | Szeto | ..................... G06N 20/10 |
| 2021/0089922 | A1 | 3/2021 | Lu et al. | |

FOREIGN PATENT DOCUMENTS

| | | |
|---|---|---|
| CN | 110728350 A | 1/2020 |
| CN | 110909865 A | 3/2020 |
| CN | 111447083 A | 7/2020 |
| CN | 111553483 A | 8/2020 |
| CN | 111901829 A | 11/2020 |
| CN | 102307372 A | 2/2021 |
| CN | 112364913 A | 2/2021 |
| CN | 112424797 A | 2/2021 |
| JP | 2012060210 A | 3/2012 |

* cited by examiner

*Primary Examiner* — Khai M Nguyen
(74) *Attorney, Agent, or Firm* — CBM Patent Consulting, LLC

(57) ABSTRACT

A communication compression method based on model weight distribution in federated learning, and belongs to the technical field of wireless communication. Based on the existing federated average idea in federated learning, counts the distribution of model weight information to be transmitted between nodes during each communication, then performs scalar quantization and compression through Lloyd-Max quantizer according to their distribution characteristics, then encodes with Huffman coding method, and finally sends the codes to the target node, thereby the minimum mean square quantization error is realized and the number of bits required for communication is reduced.

4 Claims, 3 Drawing Sheets

US 11,468,370 B1

COMMUNICATION COMPRESSION METHOD BASED ON MODEL WEIGHT DISTRIBUTION IN FEDERATED LEARNING

CROSS REFERENCES

This application claims priority to Chinese Patent Application Ser. No. CN 202110568987.7 filed on 25 May 2021.

TECHNICAL FIELD

The present invention relates to a communication compression method based on model weight distribution in federated learning, and belongs to the technical field of wireless communication.

BACKGROUND

Federated learning is an emerging distributed learning method that protects the privacy and security of user data upon an idea of performing training locally.

In traditional distributed learning framework, in order to obtain a universal learning model, each node needs to send local data to the server for training. The privacy and security of personal data become more and more important, but the process of sharing local data has become a material weakness, under which conditions the federated learning emerged. Compared with traditional distributed learning, nodes in federated learning first use their own data to train the local model locally, instead of exchanging them with any other nodes, and then share their local model parameters weighted respectively with other nodes. Conforming to the increasing emphasis on user data privacy and security, federated learning undoubtedly has great application prospects.

In federated learning, the bandwidth occupation of communication between nodes, as an important consideration, directly affects the convergence rate of training. In the prior art, in order to reduce the bandwidth occupation, an important design idea is to compress the traffic between nodes, so as to reduce the cost of traffic as much as possible upon the limited influences on the transmission accuracy. The communication between nodes is realized by transmission gradient or transmission model, and the purpose is to exchange the update information of the model. Most of the existing compression solutions are based on the transmission gradient and use the sparse characteristic of the gradient for compression. Because the gradient information on each node needs to be consolidated to the central node and then distributed back to each node, in order to complete a model update on one node, that is, two communications only complete the gradient descent on the local node once, and there is still room for improvement in the compression of traffic.

SUMMARY OF INVENTION

In order to fix the aforesaid problem of the prior art, the present invention provides a communication compression method based on the model weight distribution in federated learning. Based on the federated average idea in federated learning, for each parameter in the model information, the distribution of the model weight information to be transmitted between nodes is first counted during each communication, followed by scalar quantization compression carried out according to its distribution characteristics, then Huffman coding method is used for coding, and finally the coded information is sent to the target node, so as to reduce the number of bits required for communication while realizing the minimum mean square quantization error.

Terminologies

1. Huffman coding: a coding method that constructs the code with different prefixes in the shortest average length by constructing the optimal binary tree completely based on the probability of occurrence of characters.
2. Lloyd-Max algorithm: an iterative algorithm to find the best quantization interval and the best quantization output according to the variable probability distribution in order to minimize the mean square quantization error in scalar quantization.

Technical Solution

Disclosed is a communication compression method based on model weight distribution in federated learning used for central communication system, wherein the central communication system includes K edge nodes and a central server, and each edge node is connected with the central server;

The edge node k stores the local data $D_k$; During the global model training cycle t, the edge node k obtains a new model parameter $w_t^k$ through the stochastic gradient descent method based on the global model $w_t$ and local data $D_k$ obtained from the central server in this iteration cycle; the value of k is 1, 2, 3, . . . K, and k is a positive integer; and the central server consolidates the updated local models of each edge node to obtain a new global model $w_{t+1}$;

The edge node only communicates with the central server in the whole federated learning process. The communication compression method is respectively applied to the process in which the central server broadcasts the global model summarized from all edge nodes to each edge node, and the process in which the edge node uploads an updated local model obtained from the training to the central server. The same parallel operation is performed on each vector parameter $[w^{(1)}, \ldots, w^{(S)}]$ in the model parameter w of the edge node. $w^{(s)}$ (s=1, 2, 3 . . . S) represents the model parameter s. Taking the vector parameter $w^{(s)}$ as an example, the communication compression method include the following steps:

(1) Fit the distribution of element $[w_1^{(s)}, w_2^{(s)}, \ldots, w_n^{(s)}]$ in the model parameter $w^{(s)}$ to be compressed, with $w_i^{(s)}$ (i=1, 2, 3 . . . n) representing the element i of the model parameter $w^{(s)}$, to obtain an approximate probability density function $p_s(w)$ of $[w_1^{(s)}, w_2^{(s)}, \ldots, w_n^{(s)}]$. For example, an image classification learning task of CIFAR-10 database is carried out through a convolutional neural network model. This network model includes two convolutional layers and three fully connected layers, and each layer has two parameters w and b. Taking the parameter w of the first fully connected layer as an example, it is a tensor containing 48,000 numbers, denoted as $w=[w_1^{(s)}, w_2^{(s)}, \ldots, w_{48000}^{(s)}]$.

(2) Set the number of quantization intervals as M, and apply the Lloyd-Max algorithm to the probability density function $p_s(w)$, to obtain the quantization interval endpoint vector $b(s)=[b_0^{(s)}, \ldots, b_M^{(s)}]$ for minimizing the mean square quantization error $\sigma_{(s)}^2$ and the quantization output value vector $v^{(s)}=[v_1^{(s)}, \ldots, v_M^{(s)}]$. $b_m^{(s)}$ (m=0, 1, 2, 3 . . . M) denotes the element m in the quantization interval endpoint vector, and $v_m^{(s)}$ (m=0, 1, 2, 3 . . . M) denotes the quantization output value m. The compression solution disclosed is to carry out parallel compression of each parameter $[w^{(1)}, \ldots, w^{(S)}]$ in $w^{(s)}$, and to quantize each parameter in $w^{(s)}$ against its distribution characteristics into an approximate value, and more specifically, the numerical range of model parameter $w^{(s)}$ is divided into multiple quantization intervals, and an output value is determined in each interval for approximating all numbers in this interval to this output value. Each quantization interval corresponds to a quantization output value. The quantization interval endpoint vector $b^{(s)}=[b_0^{(s)}, \ldots, b_M^{(s)}]$ is used to determine the quantization interval endpoints, and the quantization output value vector is used to determine the quantization output value corresponding to each quantization interval endpoint.

(3) Establish the mapping of each element $w_i^{(s)}$ in the model parameter $w^{(s)}$ in sequence to obtain the quantized lossy model parameter $Q(w^{(s)})$. After Step (2), all elements in the original model parameter $w^{(s)}$ are replaced with the corresponding approximate values, and the new model parameter is denoted as $Q(w^{(s)})$. $Q(\bullet)$ represents the mapping of each element in the model parameter according to Step (2). The resulted lossy model parameter $Q(w^{(s)})$ lost some information contained in the original model parameter $w^{(s)}$, that is, this is an lossy operation.

Properly construct $b^{(s)}=[b_0^{(s)}, \ldots, b_M^{(s)}]$ and $b^{(s)}=[b_0^{(s)}, \ldots, b_M^{(s)}]$ according to the distribution $p_s(w)$ of element $w_i^{(s)}$ in the model parameter $w^{(s)}$, to determine a mechanism for approximating all numbers in $w^{(s)}$. Utilize this mechanism to map $w^{(s)}$ to $Q(w^{(s)})$ for accomplishing the quantization. The compression process consists of this quantization procedure and the following coding procedure. The quantization will lead to the loss of accuracy, while compression will not.

(4) Adopt Huffman Coding method to encode the lossy model parameter $Q(w^{(s)})$ obtained from the quantization into the binary codes of compressed model parameter $w^{(s)}$ for transmission.

Preferably, Step (2) as disclosed herein, "Set the number of quantization intervals as M, and apply the Lloyd-Max algorithm to the probability density function $p_s(w)$, to obtain the quantization interval endpoint vector $b^{(s)}=[b_0^{(s)}, \ldots, b_M^{(s)}]$ for minimizing the mean square quantization error $\sigma_q^{(s)2}$ and the quantization output value vector $v^{(s)}=[v_1^{(s)}, \ldots, v_M^{(s)}]$", is carried out as follows:

1) Find the maximum value $w_{max}^{(s)}$ and the minimum value $w_{min}^{(s)}$ of the element $w_i^{(s)}$ in the model parameter $w^{(s)}$ to be quantized; initialize $b_0^{(s)}=w_{min}^{(s)}$ and $b_M^{(s)}=w_{max}^{(s)}$; and stochastically assign an initial value to the first quantization output value $v_1^{(s)}$ to satisfy $w_{min}^{(s)}<v_1^{(s)}<w_{max}^{(s)}$.

2) Let the index m=1.

3) Substitute $v_m^{(s)}$ and $b_{m-1}^{(s)}$ into Equation (I):

$$v_m^{(s)} = \frac{\int_{b_{m-1}^{(s)}}^{b_m^{(s)}} w p_s(w) dw}{\int_{b_{m-1}^{(s)}}^{b_m^{(s)}} p_s(w) dw}, m = 1, 2, \ldots, M, \quad (I)$$

to solve $b_m^{(s)}$.

4) Substitute $v_m^{(s)}$ and $b_m^{(s)}$ into Equation (II):

$$b_m^{(s)} = \frac{1}{2}(v_m^{(s)} + v_{m+1}^{(s)}), m = 1, 2, \ldots, M, \quad (II)$$

to solve $v_{m+1}^{(s)}$.

5) Increase m by 1.

6) Go back to Sub-step 3) if m<M, or otherwise go to Sub-step 7).

7) Solve all elements of $b^{(s)}=[b_0^{(s)}, \ldots, b_M^{(s)}]$ and $v^{(s)}=[v_1^{(s)}, \ldots, v_M^{(s)}]$ through the iterative computation from Sub-step 2) to Sub-step 6); continue adjusting the initial value of $v_1^{(s)}$ to repeat the iteration from Sub-step 2) to Sub-step 6) till the difference between $v_M^{(s)}$ and $$\frac{\int_{b_{M-1}^{(s)}}^{b_M^{(s)}} w p_s(w) dw}{\int_{b_{M-1}^{(s)}}^{b_M^{(s)}} p_s(w) dw}$$

is less than the preset threshold value, to obtain the required quantization interval endpoint vector $b^{(s)}=[b_0^{(s)}, \ldots, b_M^{(s)}]$ and quantization output value vector $v^{(s)} [v_1^{(s)}, \ldots, v_M^{(s)}]$.

Preferably, Step (3) as disclosed herein, "Establish the mapping of each element $w_i^{(s)}$ in the model parameter $w^{(s)}$ to obtain the quantized lossy model parameter $Q(w^{(s)})$", is carried out as follows:

By utilizing the optimal quantization interval endpoint vector $b^{(s)}$ to divide the distribution interval $w_i$ into M segments, and then map the element $w_i^{(s)}$ falling in each interval to the value of the corresponding sequence in the quantization output vector $v^{(s)}$. $b^{(s)}$ and $v^{(s)}$ jointly determine the mode for mapping each element $w_i^{(s)}$ in the model parameter $w^{(s)}$, $Q(\bullet)$ denotes the mapping of each element in the model parameter $w^{(s)}$ according to this mode, and $Q(w^{(s)})$ represents the resulted model parameter. Since $Q(w^{(s)})$ is obtained by mapping all internal elements, all elements of $Q(w^{(s)})$ exist in $v^{(s)}$.

Preferably, Step (4) as disclosed herein, "Adopt Huffman Coding method to encode the lossy model parameter $Q(w^{(s)})$ obtained from the quantization into the binary codes of compressed model parameter $w^{(s)}$ for transmission", is carried out as follows:

a. According to all elements in the model parameter $Q(w^{(s)})$ and their frequencies of occurrence (for example, as for $Q(w^{(s)})=(1, 1, 2, 2, 2, 3)$, the frequencies of occurrence of elements "1", "2" and "3" are ⅓, ½ and ⅙ respectively), arrange the elements in the descending order of probability, encode from two smallest elements, and merged them into a single element, with the smaller one marked as 0 and the larger one marked as 1.

b. Update all elements as described in Sub-step a, rearrange them and merge the smallest two elements. In this sub-step, "update" means that, after the smallest two elements in total T elements are merged into one element, the resulted T−1 elements are rearranged in the descending order of probability.

c. Repeat Sub-steps a and b till the probability of remaining element increases to 1, to obtain a Huffman Tree.

d. Starting from the final node with probability of 1 in the Huffman tree, for each element, there is and only one path to the leaf node representing the element. Read the binary sequence marked in the path in turn to obtain the Huffman code of the element. Finally, compress the model parameter vector to be compressed into the binary Huffman code for actual transmission. Huffman tree is a tree structure. When the Huffman tree is determined, the path from the final node to each initial node is unique. Leaf node refers to each initial node, that is, each different element of the model parameter $Q(w^{(s)})$ with their respective occurrence probability after quantization.

Advantageous Effects

1. The present invention discloses a weight distribution based communication compression method suitable for the communication and transmission scenarios during the model update in federated learning. On the basis of the statistical distribution characteristics of the parameters of compressed learning model, this invention can reduce the communication cost while improving the learning efficiency.
2. The present invention applies the idea of federated average to compress the transmitted model parameters. Compared with existing federated learning compression methods, it can reduce a large number of communication frequencies because local training and model updating can be carried out many times before each communication.
3. The present invention utilizes the Lloyd-Max quantizer to minimize the mean square quantization errors in the scalar quantization process.
4. The present invention adopts the Huffman coding method to encode the quantized model parameters. Since the Huffman codes have the shortest average length and are constructed completely according to the occurrence probability of characters, this invention ensures that only the shortest binary codes are actually transmitted, to reduce the occupation of communication bandwidth.

DETAILED DESCRIPTIONS

The present invention is described in detail in conjunction with the Drawings and Embodiments as follows (but not limited to the following descriptions).

Example 1

Figure 1:
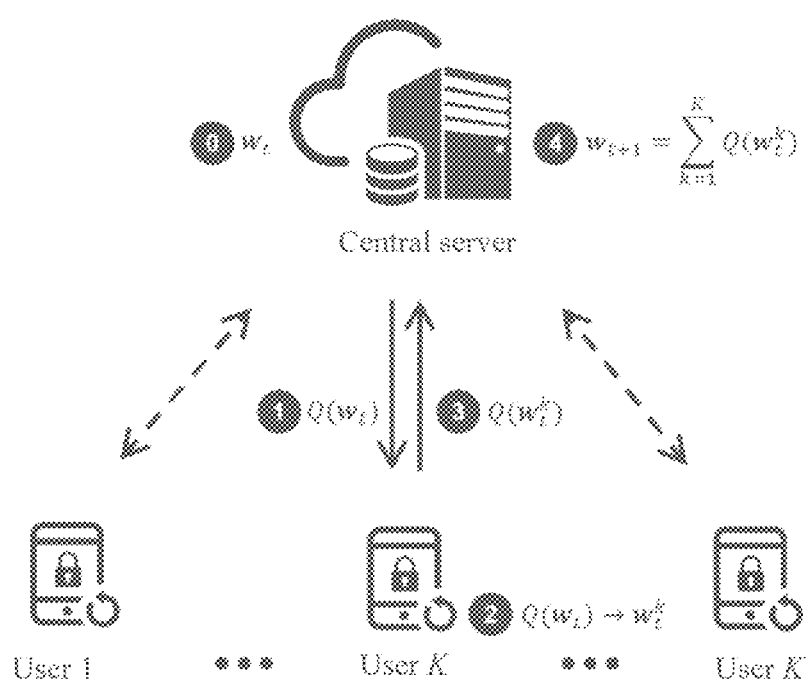
FIG. 1 shows a system diagram of federated learning communication compression in the present invention.

Disclosed is a communication compression method based on model weight distribution in federated learning used for central communication system, as shown in FIG. 1, wherein the central communication system includes K edge nodes and a central server, and each edge node is connected with the central server.

The edge node k stores the local data $D_k$; During the global model training cycle t, the edge node k obtains a new model parameter $w_t^k$ through the stochastic gradient descent method based on the global model $w_t$ and local data $D_k$ obtained from the central server in this iteration cycle; the value of k is 1, 2, 3, . . . K, and k is a positive integer; and the central server consolidates the updated local models of each edge node to obtain a new global model $w_{t+1}$;

The edge node only communicates with the central server in the whole federated learning process. The communication compression method is respectively applied to the process in which the central server broadcasts the global model summarized from all edge nodes to each edge node, and the process in which the edge node uploads an updated local model obtained from the training to the central server. The same parallel operation is performed on each vector parameter $[w^{(1)}, \ldots, w^{(S)}]$ in the model parameter w of the edge node. $w^{(s)}$ (s=1, 2, 3 . . . S) represents the model parameter s. Taking the vector parameter $w^{(s)}$ as an example, the communication compression method include the following steps:

(1) Fit the distribution of element $[w_1^{(s)}, w_2^{(s)}, \ldots, w_n^{(s)}]$ in the model parameter $w^{(s)}$ to be compressed, with $w_i^{(s)}$ (i=1, 2, 3 . . . n) representing the element i of the model parameter $w^{(s)}$, to obtain an approximate probability density function $p_s(w)$ of $[w_1^{(s)}, w_2^{(s)}, \ldots, w_n^{(s)}]$. For example, an image classification learning task of CIFAR-10 database is carried out through a convolutional neural network model. This network model includes two convolutional layers and three fully connected layers, and each layer has two parameters w and b. Taking the parameter w of the first fully connected layer as an example, it is a tensor containing 48,000 numbers, denoted as $w=[w_1^{(s)}, w_2^{(s)}, \ldots, w_{48000}^{(s)}]$.

(2) Set the number of quantization intervals as M, and apply the Lloyd-Max algorithm to the probability density function $p_s(w)$, to obtain the quantization interval endpoint vector $b^{(s)}=[b_0^{(s)}, \ldots, b_M^{(s)}]$ for minimizing the mean square quantization error $\sigma_q^{(s)2}$ and the quantization output value vector $v^{(s)}=[v_1^{(s)}, \ldots, v_M^{(s)}]$. $b_m^{(s)}$ (m=0, 1, 2, 3 . . . M) denotes the element m in the quantization interval endpoint vector, and $v_m^{(s)}$ (m=0, 1, 2, 3 . . . M) denotes the quantization output value m. The compression solution disclosed is to carry out parallel compression of each parameter $[w^{(1)}, \ldots, w^{(S)}]$ in $w^{(s)}$, and to quantize each parameter in $w^{(s)}$ against its distribution characteristics into an approximate value, and more specifically, the numerical range of model parameter $w^{(s)}$ is divided into multiple quantization intervals, and an output value is determined in each interval for approximating all numbers in this interval to this output value. Each quantization interval corresponds to a quantization output value. The quantization interval endpoint vector $b^{(s)}=[b_0^{(s)}, \ldots, b_M^{(s)}]$ is used to determine the quantization interval endpoints, and the quantization output value vector is used to determine the quantization output value corresponding to each quantization interval endpoint.

This Step is carried out as follows:

1) Find the maximum value $w_{max}^{(s)}$ and the minimum value $w_{min}^{(s)}$ of the element $w_i^{(s)}$ in the model parameter $w^{(s)}$ to be quantized; initialize $b_0^{(s)}=w_{min}^{(s)}$ and $b_M^{(s)}=w_{max}^{(s)}$; and stochastically assign an initial value to the first quantization output value $v_1^{(s)}$ to satisfy $w_{min}^{(s)}<v_1^{(s)}<w_{max}^{(s)}$.

2) Let the index m=1.
3) Substitute $v_m^{(s)}$ and $b_{m-1}^{(s)}$ iinto Equation (I):

$$v_m^{(s)} = \frac{\int_{b_{m-1}^{(s)}}^{b_m^{(s)}} w p_s(w) dw}{\int_{b_{m-1}^{(s)}}^{b_m^{(s)}} p_s(w) dw}, m = 1, 2, \ldots, M, \quad (I)$$

to solve $b_m^{(s)}$.
4) Substitute $v_m^{(s)}$ and $b_m^{(s)}$ into Equation (II):

$$b_m^{(s)} = \frac{1}{2}(v_m^{(s)} + v_{m+1}^{(s)}), m = 1, 2, \ldots, M, \quad (II)$$

to solve $v_{m+1}^{(s)}$.
5) Increase m by 1.
6) Go back to Sub-step 3) if m<M, or otherwise go to Sub-step 7).
7) Solve all elements of $b^{(s)} = [b_0^{(s)}, \ldots, b_M^{(s)}]$ and $v^{(s)} = [v_1^{(s)}, \ldots, v_M^{(s)}]$ through the iterative computation from Sub-step 2) to Sub-step 6); continue adjusting the initial value of $v_1^{(s)}$ to repeat the iteration from Sub-step 2) to Sub-step 6) till the difference between $v_M^{(s)}$ and $$\frac{\int_{b_{M-1}^{(s)}}^{b_M^{(s)}} w p_s(w) dw}{\int_{b_{M-1}^{(s)}}^{b_M^{(s)}} p_s(w) dw}$$

is less than the preset threshold value, to obtain the required quantization interval endpoint vector $b^{(s)} = [b_0^{(s)}, \ldots, b_M^{(s)}]$ and quantization output value vector $v^{(s)} = [v_1^{(s)}, \ldots, v_M^{(s)}]$.

(3) Establish the mapping of each element $w_i^{(s)}$ in the model parameter $w^{(s)}$ to obtain the quantized lossy model parameter $Q(w^{(s)})$. After Step (2), all elements in the original model parameter $w^{(s)}$ are replaced with the corresponding approximate values, and the new model parameter is denoted as $Q(w^{(s)})$. $Q(\bullet)$ represents the mapping of each element in the model parameter according to Step (2). The resulted lossy model parameter $Q(w^{(s)})$ lost some information contained in the original model parameter $Q(w^{(s)})$, that is, this operation is lossy.

Properly construct $b^{(s)} = [b_0^{(s)}, \ldots, b_M^{(s)}]$ and $b^{(s)} = [b_0^{(s)}, \ldots, b_M^{(s)}]$ according to the distribution $p_s(w)$ of element $w_i^{(s)}$ in the model parameter $w^{(s)}$, to determine a mechanism for approximating all numbers in $w^{(s)}$. Utilize this mechanism to map $w^{(s)}$ to $Q(w^{(s)})$ for accomplishing the quantization. The compression process consists of this quantization procedure and the following coding procedure. The quantization will lead to the loss of accuracy, while compression will not.

This Step is carried out as follows:
By utilizing the optimal quantization interval endpoint vector $b^{(s)}$ to divide the distribution interval $w_i$ into Msegments, and then map the element $w_i^{(s)}$ falling in each interval to the value of the corresponding sequence in the quantization output vector $v^{(s)}$. $b^{(s)}$ and $v^{(s)}$ jointly determine the mode for mapping each element $w_i^{(s)}$ in the model parameter $w^{(s)}$, $Q(\bullet)$ denotes the mapping of each element in the model parameter $w^{(s)}$ according to this mode, and $Q(w^{(s)})$ represents the resulted model parameter. Since $Q(w^{(s)})$ is obtained by mapping all internal elements, all elements of $Q(w^{(s)})$ exist in $v^{(s)}$.

(4) Adopt Huffman Coding method to encode the lossy model parameter $Q(w^{(s)})$ obtained from the quantization into the binary codes of compressed model parameter $w^{(s)}$ for transmission.

This Step is carried out as follows:
a. According to all elements in the model parameter $Q(w^{(s)})$ and their frequencies of occurrence (for example, as for $Q(w^{(s)}) = (1, 1, 2, 2, 2, 3)$, the frequencies of occurrence of elements "1", "2" and "3" are ⅓, ½ and ⅙ respectively), arrange the elements in the descending order of probability, encode from two smallest elements, and merged them into a single element, with the smaller one marked as 0 and the larger one marked as 1.
b. Update all elements as described in Sub-step a, rearrange them and merge the smallest two elements. In this sub-step, "update" means that, after the smallest two elements in total T elements are merged into one element, the resulted T−1 elements are rearranged in the descending order of probability.
c. Repeat Sub-steps a and b till the probability of remaining element increases to 1, to obtain a Huffman Tree.
d. Starting from the final node with probability of 1 in the Huffman tree, for each element, there is and only one path to the leaf node representing the element. Read the binary sequence marked in the path in turn to obtain the Huffman code of the element. Finally, compress the model parameter vector to be compressed into the binary Huffman code for actual transmission. Huffman tree is a tree structure. When the Huffman tree is determined, the path from the final node to each initial node is unique. Leaf node refers to each initial node, that is, each different element of the model parameter $Q(w^{(s)})$ with their respective occurrence probability after quantization.

Compared with existing federated learning compression methods, the method disclosed herein applies the idea of federated average and therefore can reduce a large number of communication frequencies because local training and model updating can be carried out many times before each communication.

The quantization procedure utilizes the Lloyd-Max algorithm to ensure the minimization of the mean square quantization errors in the scalar quantization process.

The coding procedure adopts the Huffman coding method and can ensure that only the shortest binary codes are actually transmitted, for the Huffman codes have the shortest average length and are constructed completely according to the occurrence probability of characters.

The present invention compresses model parameters based on the transmission model scenarios, and the local node can use the gradient information to iterate the local model for many times before each communication between nodes, so that each communication contains more model update information. For model information, since the weights of each parameter follow certain distribution characteristics, the use of a compression method based on the distribution of model weights can reduce communication costs while preserving accuracy to the greatest extent.

In the Example, each local node uses the CNN model to train the data in the image dataset CIFAR-10. First, each edge node uses local data to train the optimal local training model parameters, and then aggregates them to the central server for weighted average. After the updated global model parameters are broadcast by the server to each local node, a global iteration cycle ends. In this cycle, both the aggregation and broadcasting processes involve the disclosed communication compression method.

Traditional methods include the baseline algorithm based on federated stochastic gradient descent (exchange gradient), the Top-k algorithm, the QSGD algorithm, and the baseline algorithm based on federated average (exchange model). The baseline algorithm refers to the uncompressed algorithm. The idea of Top-k is to keep only the first part of the gradient with the largest absolute value before each communication, and set all other numbers to 0. [S. U. Stich, J.-B. Cordonnier, and M. Jaggi, "Sparsified SGD with memory," in Proc. NeurIPS 2018, Montreal, QC, Canada, December 2018, pp. 4447-4458.]

QSGD first divides the parameter range into multiple intervals, maps each element in the parameter to the nearest interval endpoint, and then uses the Elias encoding method to reduce the number of bits required for encoding by taking advantage of the low frequency of large numbers. [D. Alistarh, D. Grubic, J. Li, R. Tomioka, and M. Vojnovic, "QSGD: Communication-efficient SGD via gradient quantization and encoding," in Proc. NIPS 2017, Long Beach, Calif., United states, December 2017, pp. 1710-1721.]

Figure 2:
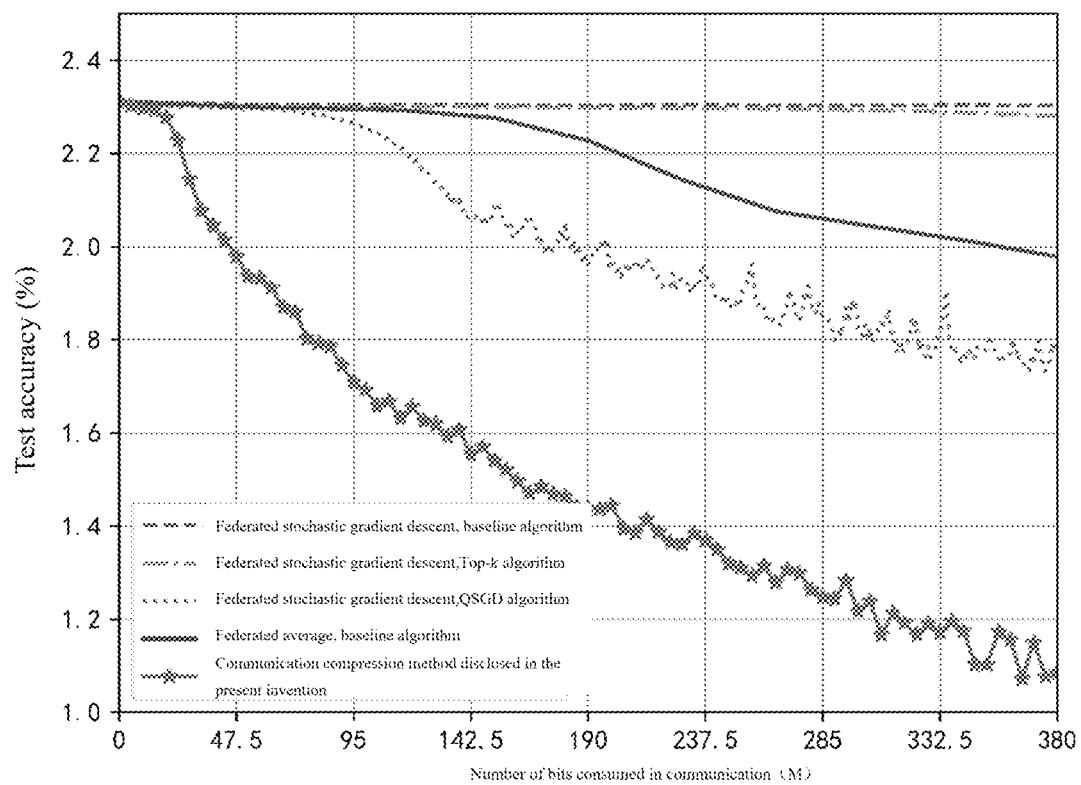
FIG. 2 is a schematic diagram of the comparison between the communication compression methods disclosed by the present invention and the traditional communication compression method in the decline of training loss along with communication consumption.

FIG. 2 shows the comparison of the decrease of training loss with communication consumption under each compression scheme. The abscissa denotes the number of bits consumed by the transmission; the ordinate denotes the training loss, which is the difference between the result predicted by the training model and the actual value. The number of quantization intervals M=256. It can be seen from FIG. 2 that, under the condition of consuming the same communication resources, the communication compression method disclosed by the present invention can reduce the training loss of the system faster than other methods. In practical applications, the number of quantization intervals can be adjusted to balance the compression accuracy and compression degree.

Figure 3:
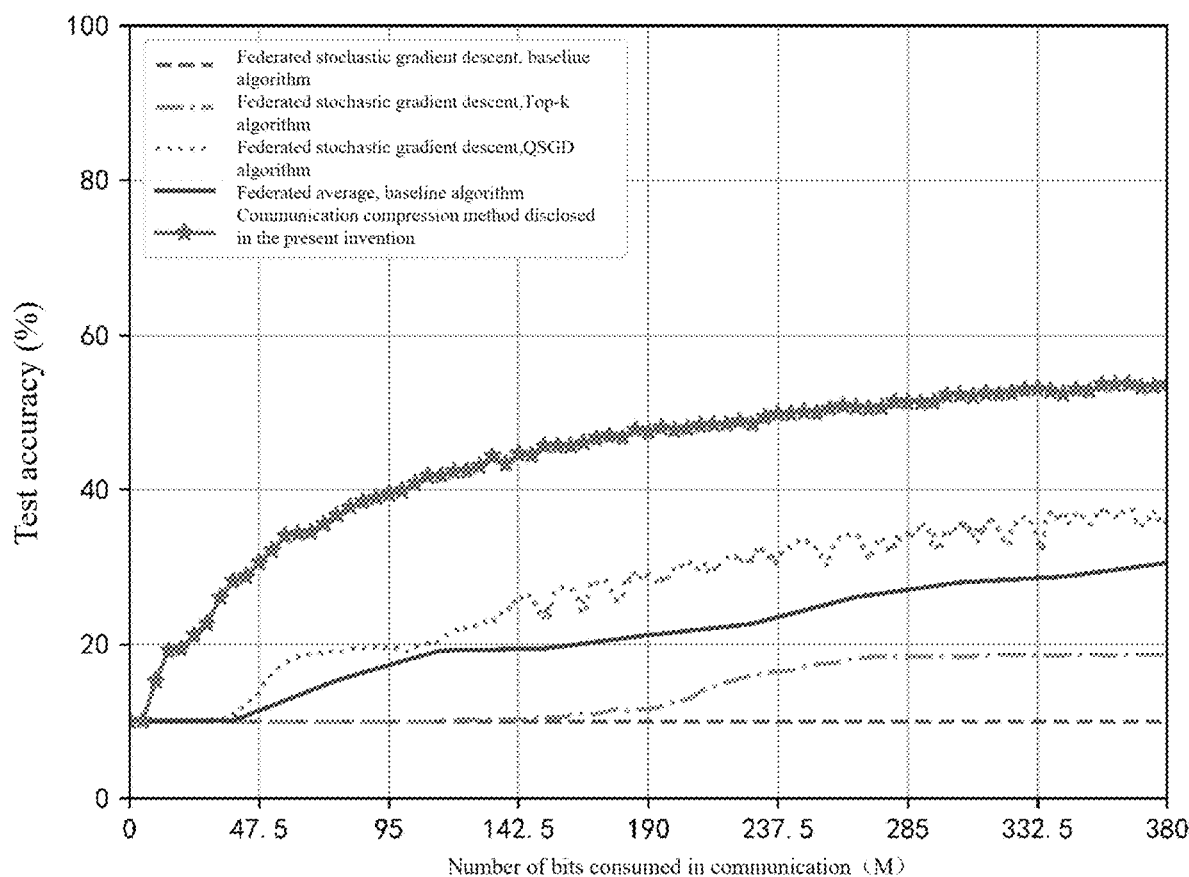
FIG. 3 is a schematic diagram of the comparison between the communication compression method disclosed by the present invention and the traditional communication compression method in the increase of test accuracy along with the communication consumption.

FIG. 3 shows the comparison of the test accuracy with the increase of communication consumption in each compression solution. The abscissa denotes the number of bits consumed by transmission, and the ordinate denotes the test accuracy rate, which is the success rate predicted by the training model on the test set. It can be seen from FIG. 3 that under the condition of consuming the same resources, the communication compression method disclosed by the present invention can improve the test accuracy faster than other methods.

It can be seen from FIG. 2 and FIG. 3 that the central time synchronization federated learning communication compression method disclosed by the present invention effectively improves the communication cost efficiency of the system, and achieves a better learning effect faster while consuming less communication bandwidth, promising high practicability.

What is claimed is:

1. A communication compression method based on model weight distribution in federated learning, which is characterized in that it is used for central communication system, wherein the central communication system includes K edge nodes and a central server, and each edge node is connected with the central server;

the edge node only communicates with the central server in the whole federated learning process; the communication compression method is respectively applied to the process in which the central server broadcasts the global model summarized from all edge nodes to each edge node, and the process in which the edge node uploads an updated local model obtained from the training to the central server. The same parallel operation is performed on each vector parameter $[w^{(1)}, \ldots, w^{(S)}]$ in the model parameter w of the edge node. $w^{(s)}$ (s=1, 2, 3 . . . S) represents the model parameter s. Taking the vector parameter $w^{(s)}$ as an example, the communication compression method include the following steps:

i) fit the distribution of element $[w_1^{(s)}, w_2^{(s)}, \ldots, w_n^{(s)}]$ in the model parameter $w^{(s)}$ to be compressed, with $w_i^{(s)}$ (i=1, 2, 3 . . . n) representing the element i of the model parameter $w^{(s)}$, to obtain an approximate probability density function $p_s(w)$ of $[w_1^{(s)}, w_2^{(s)}, \ldots, w_n^{(s)}]$;

ii) set the number of quantization intervals as M, and apply the Lloyd-Max algorithm to the probability density function $p_s(w)$, to obtain the quantization interval endpoint vector $b^{(s)}=[b_0^{(s)}, \ldots, b_M^{(s)}]$ for minimizing the mean square quantization error $\sigma_q^{(s)\,2}$ and the quantization output value vector $v^{(s)}=[v_1^{(s)}, \ldots, v_M^{(s)}]$. $b_m^{(s)}$ (m=0, 1, 2, 3 . . . M) denotes the element m in the quantization interval endpoint vector, and $v_m^{(s)}$ (m=0, 1, 2, 3 . . . M) denotes the quantization output value m. The quantization interval endpoint vector $b^{(s)}=[b_0^{(s)}, \ldots, b_M^{(s)}]$ is used to determine the quantization interval endpoints, and the quantization output value vector is used to determine the quantization output value corresponding to each quantization interval endpoint;

iii) establish the mapping of each element $w_i^{(s)}$ in the model parameter $w^{(s)}$ in sequence to obtain the quantized lossy model parameter $Q(w^{(s)})$; and iv) adopt Huffman Coding method to encode the lossy model parameter $Q(w^{(s)})$ obtained from the quantization into the binary codes of compressed model parameter $w^{(s)}$ for transmission.

2. The communication compression method based on model weight distribution in federated learning as set forth in claim 1, which is characterized in that step ii) "set the number of quantization intervals as M, and apply the Lloyd-Max algorithm to the probability density function $p_s(w)$, to obtain the quantization interval endpoint vector $b^{(s)}=[b_0^{(s)}, \ldots, b_M^{(s)}]$ for minimizing the mean square quantization error $\sigma_q^{(s)2}$ and the quantization output value vector $v^{(s)}=[v_1^{(s)}, \ldots, v_M^{(s)}]$" is carried out as follows:

a) find the maximum value $w_{max}^{(s)}$ and the minimum value $w_{min}^{(s)}$ of the element $w_i^{(s)}$ in the model parameter $w^{(s)}$ to be quantized; initialize $b_0^{(s)}=w_{min}^{(s)}$ and $b_M^{(s)}=w_{max}^{(s)}$; and stochastically assign an initial value to the first quantization output value $v_1^{(s)}$ to satisfy $w_{min}^{(s)}<v_1^{(s)}<w_{max}^{(s)}$;

b) let the index m=1;

c) substitute $v_m^{(s)}$ and $b_{m-1}^{(s)}$ into Equation (I):

$$v_m^{(s)} = \frac{\int_{b_{m-1}^{(s)}}^{b_m^{(s)}} w p_s(w) dw}{\int_{b_{m-1}^{(s)}}^{b_m^{(s)}} p_s(w) dw}, m = 1, 2, \ldots, M, \quad (I)$$

to solve $b_m^{(s)}$;

d) substitute $v_m^{(s)}$ and $b_m^{(s)}$ into Equation (II):

$$b_m^{(s)} = \frac{1}{2}(v_m^{(s)} + v_{m+1}^{(s)}), m = 1, 2, \ldots, M, \quad (II)$$

to solve $v_{m+1}^{(s)}$;

e) increase m by 1;

f) go back to Sub-step 3) if m<M, or otherwise go to Sub-step 7); and g) solve all elements of $b^{(s)}=[b_0^{(s)}, \ldots, b_M^{(s)}]$ and $v^{(s)}=[v_1^{(s)}, \ldots, v_M^{(s)}]$ through the iterative computation from Sub-step 2) to Sub-step 6); continue adjusting the initial value of $v_1^{(s)}$ to repeat the iteration from Sub-step 2) to Sub-step 6) till the difference between $v_M^{(s)}$ and $$\frac{\int_{b_{M-1}^{(s)}}^{b_M^{(s)}} w p_s(w) dw}{\int_{b_{M-1}^{(s)}}^{b_M^{(s)}} p_s(w) dw}$$

is less than the preset threshold value, to obtain the required quantization interval endpoint vector $b^{(s)}=[b_0^{(s)}, \ldots, b_M^{(s)}]$ and quantization output value vector $v^{(s)}=[v_1^{(s)}, \ldots, v_M^{(s)}]$.

3. The communication compression method based on model weight distribution in federated learning as set forth in claim 1, which is characterized in that step iii) "Establish the mapping of each element $w_i^{(s)}$ in the model parameter $w^{(s)}$ in sequence to obtain the quantized lossy model parameter $Q(w^{(s)})$" is carried out as follows:

by utilizing the optimal quantization interval endpoint vector $b^{(s)}$ to divide the distribution interval $w_i$ into M segments, and then map the element $w_i^{(s)}$ falling in each interval to the value of the corresponding sequence in the quantization output vector $v^{(s)}$.

4. The communication compression method based on model weight distribution in federated learning as set forth in claim 1, which is characterized in that step iv) "Adopt Huffman Coding method to encode the lossy model parameter $Q(w^{(s)})$ obtained from the quantization into the binary codes of compressed model parameter $w^{(s)}$ for transmission" is carried out as follows:

a) according to all elements in the model parameter $Q(w^{(s)})$ and their frequencies of occurrence, arrange the elements in the descending order of probability, encode from two smallest elements, and merged them into a single element, with the smaller one marked as 0 and the larger one marked as 1;

b) update all elements as described in Sub-step a, rearrange them and merge the smallest two elements;

c) repeat Sub-steps a and b till the probability of remaining element increases to 1, to obtain a Huffman Tree; and d) starting from the final node with probability of 1 in the Huffman tree, for each element, there is and only one path to the leaf node representing the element; read the binary sequence marked in the path in turn to obtain the Huffman code of the element; finally, compress the model parameter vector to be compressed into the binary Huffman code for actual transmission.

* * * * *